United States Patent
Lee et al.

(10) Patent No.: US 6,841,431 B2
(45) Date of Patent: Jan. 11, 2005

(54) METHOD FOR REDUCING THE CONTACT RESISTANCE

(75) Inventors: Yu-Chou Lee, Shu-Lin (TW); Min-Ching Hsu, Ma-Kuang (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 10/352,937

(22) Filed: Jan. 29, 2003

(65) Prior Publication Data

US 2004/0147133 A1 Jul. 29, 2004

(51) Int. Cl.[7] .......................... H01L 21/00; H01L 21/84
(52) U.S. Cl. ....................... 438/158; 438/149; 438/704; 438/711
(58) Field of Search ................................ 438/149, 151, 438/158, 159, 689, 704, 709–711, 719, 162, 30, 166

(56) References Cited

U.S. PATENT DOCUMENTS

| | | | | |
|---|---|---|---|---|
| 5,534,445 A | * | 7/1996 | Tran et al. .................... | 438/162 |
| 5,686,349 A | * | 11/1997 | Nakata ........................ | 438/485 |
| 5,837,592 A | * | 11/1998 | Chang et al. ................ | 438/382 |
| 5,998,229 A | * | 12/1999 | Lyu et al. ..................... | 438/30 |
| 6,552,759 B2 | * | 4/2003 | Kim et al. .................... | 349/43 |

* cited by examiner

Primary Examiner—Amir Zarabian
Assistant Examiner—Khanh Duong
(74) Attorney, Agent, or Firm—Birch, Stewart, Kolasch & Birch, LLP

(57) ABSTRACT

A method for reducing the contact resistance using plasma process tries to solve the problem that the cleaning process could not remove both the residues and oxides on the etched surface effectively. A plasma treating process is performed after the cleaning process and before any following process. Herein, the plasma treating process uses the plasma(s) to physically and/or chemically react with the etched surface. For example, inert gas plasma is used to remove these residues and the oxides, and then hydrogen plasma is used to compensate the unsaturated bonds by inducing the ions bombardment of the inert gas plasma.

28 Claims, 6 Drawing Sheets

| | Hydrogen gas flow rate 24000sccm Pressure 1.2mabr | RF power Period | 200Walt 5second |
|---|---|---|---|
| Comparative group | Metal contact resistance 3.12 ohm | Metal contact resistance 4.58 ohm | Metal contact resistance 18.741 ohm |
| Comparative group | Metal contact resistance 2.82 ohm | Metal contact resistance 6.945 ohm | |
| | Hydrogen gas flow rate 24000sccm Pressure 1.2mabr Nitrogen gas flow rate 20000sccm Pressure 1.0mabr | RF power Period RF power Period | 200Walt 5second 80Walt 5second |
| Expertmental group | Metal contact resistance 3.987 ohm | Metal contact resistance 6.05 ohm | Metal contact resistance 12.4787 ohm |
| Expertmental group | | | |

FIG.3

METHOD FOR REDUCING THE CONTACT RESISTANCE

BACKGROUND OF THE INVENTION

1. Field of the Invention

The invention relates to a method for reducing the contact resistance, and especially is related to a method that effectively removes the residuals and oxides by inducing etch process.

2. Description of the Prior Art

For a semiconductor product, a conductive structure is usually formed over another conductive structure to form a complete conductive or a complete device. For example, for the thin film transistor (TFT), a conductor layer, such as polysilicon layer or amorphous layer, is etched to form the source/drain of the TFT, and then a dielectric layer is formed over a patterned conductor layer. Next, some openings are formed in the dielectric layer to expose partial patterned conductor layer, and then a patterned metal is formed on the dielectric layer and in the openings to form the required conductive line.

Clearly, the contact resistance between some adjacent structures is a portion of the resistance of the complete semiconductor device. Moreover, each semiconductor structure is made of conductive material with low resistance, which means their resistance is predictable and controllable, and the contact resistance is induced by the practical fabricating process, which is hardly predicted and controlled. Hence, reduction of the contact resistance is an important problem. Especially, a conductive structure is usually formed by etching a deposited conductive layer into a required pattern, but the etching process usually produces residuals and oxides on the etched surface such that both the resistance and capacitance on the etched surface are increased. Hence, prevention of the effect of the residuals and oxides is the key to reduce the contact resistance.

Regarding the problem, the prior art has the following solution: using the helium gas plasma to treat the patterned surface to remove residuals and oxides, while the etching process is just finished; using both the helium gas plasma and hydrogen gas plasma to treat the patterned surface to remove residuals and oxides while the etching process is just finished; or using the cleaning process, such as wet solution cleaning process and gas cleaning process, to treat the patterned surface for removing residuals and oxides before any sequential process is performed. However, according to the experimental datas, all prior art only can reduce the number of both residuals and oxides but can not let the number of both residuals and oxides be reduced to be negligible, especially the oxides on the patterned surface cannot be removed effectively. Therefore, the effect of contact resistance between adjacent conductive structures is still negligible.

Accordingly, it is desired to develop a new technology to effective remove both residuals and oxides on the patterned surface. Moreover, to reduce the cost and difficulty, it is important to develop a new technology which is compatible with the conventional fabrication of semiconductor product.

SUMMARY OF THE INVENTION

An object of the invention is to reduce the contact resistance, especially the contact resistance between a conductive structure and an adjacent conductive structure.

Another object of the invention is to reduce the contact resistance, especially to reduce the contact resistance that is induced by residuals and oxides on the surface between adjacent conductive structures.

Still an object of the invention is to reduce the contact resistance, especially to reduce the resistance of a surface of a patterned conductive structure that cannot be effectively reduced by conventional cleaning process.

One main characteristic of the present invention is to perform a plasma treating process to treat a surface of a patterned conductive structure while the conventional cleaning process is just finished. Hence, the non-removed residuals and oxides are removed again by the plasma treating process. After the plasma treating process is finished, the sequential conventional processes are performed.

According to the practical requirement, the present invention utilizes a plasma physically reacted with the surface, such that the surface is treated. Furthermore, the surface could be treated by other plasma, which is chemically reacted with the surface. For example, first plasma is initially used to physically react with the surface of patterned structure. Then, a second plasma is used to chemically react with the surface of the patterned structure. Herein, the parameters of the second plasma are adjusted to let almost all unsaturated bonds on the surface of patterned structure induced by the first plasma that reacted with the second plasma. For example, inert gas plasma is initially used to remove residuals and oxides, and then hydrogen gas plasma is used to react with the unsaturated bonds by inducing the ion bombardment of inert gas plasma.

The efficiency of the present invention is represented by some experimental data as shown in FIG. 3. In FIG. 3, the comparative group shows the measured metal conduct resistances that is induced by the prior art that only uses the hydrogen plasma but not use the helium plasma before the cleaning process, and the experimental group also shows the measured metal conduct resistance that is induced by the present invention that uses both the hydrogen plasma and the helium plasma after the cleaning process. Herein, the values of all parameters (such as flow rate of gas, power of RF source, pressure, or period) are fixed, but the sample is different to measure. According to the measured results, the present invention can reduce about 10% to 34% of the conventional contact resistance.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, which are given by way of illustration only, and thus are not limitative of the present invention, and wherein:

FIG. 3 is a table for showing some experimental data to compare the result of the present invention with the prior art.

DESCRIPTION OF THE PREFERRED EMBODIMENT

Figure 1:
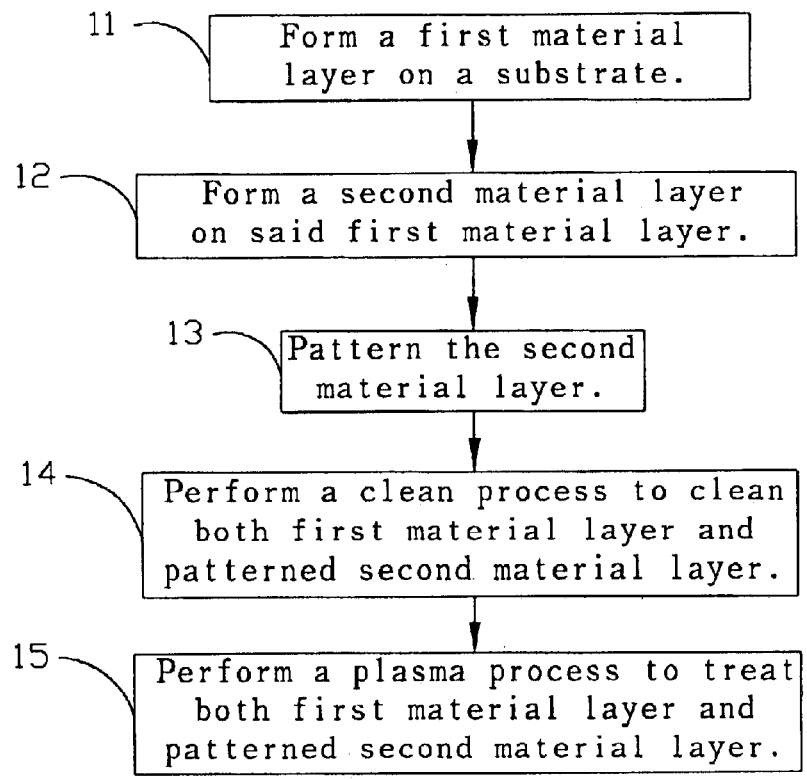
FIG. 1 shows the essential flow-chart of one preferred embodiment of the invention.

A preferred embodiment of the present invention is a method for reducing the contact resistance. As shown in FIG. 1, the method has at least the following essential steps.

As shown in first background block 11, a first material layer on a substrate is formed. Herein, the material of the first material layer is chosen from the group consisting of metal, metal silicide, polysilicon, amorphous silicon, doped polysilicon and doped amorphous silicon.

As shown in second background block 12, a second material layer is formed on said first material layer. Herein, the material of the second material layer is chosen from the group consisting of metal, metal silicide, polysilicon, doped amorphous silicon and doped polysilicon.

As shown in pattern block 13, the second material layer is patterned. Herein, it is optional to pattern first material layer, it also is optional to remove partial first material layer.

As shown in clean block 14, a cleaning process is performed to clean both first material layer and patterned second material layer. Herein, the cleaning process is chosen from the group consisting of wet solution cleaning process and gas cleaning process.

As shown in plasma block 15, a plasma treating process is performed to treat both first material layer and patterned second material layer.

Significantly, one important characteristic of the present invention is that the plasma treating process is performed immediately after the conventional cleaning process that is finished and before any following process is performed. Hence, after the patterned surface is formed, such as formed by etching process, any residual and any oxide that cannot be removed effectively by conventional cleaning process. But, the residual and oxides can be removed again by the plasma. Thus, the appearance of negligible contact resistance could be effectively reduced.

Moreover, one essential characteristic of the present invention is described as following: Initially, a first plasma is used to physically react with both the patterned second material layer and the first material layer, such that residuals and oxides attached on the surface of both material layers are removed (not attached again). Next, a second plasma is used to chemically react with the patterned second material and the first material layer, such that all unsaturated bonds on the surface induced by the first plasma are thorough reacted. In other words, the second plasma is used to drastically reduce the number of dealing bond or weak bond on the surface treated by the first plasma.

Therefore, after the plasma treating process is finished, at least without residuals or oxides exist on the treated surface of the material layers, and also at least almost without unsaturated bonds exists on the treated surface. Indisputably, the contact resistance is significantly decreased.

However, it should be noticed that the embodiment does not always require using both first plasma and second plasma in sequence. If only using first plasma or second plasma, the contact resistance could be effectively reduced. Thus, the embodiment of the present invention can use the first plasma or the second plasma to perform the plasma treating process. For example, while the number of both dealing bonds and weak bonds induced by the first plasma could be negligible, the usage of the second plasma is optional. For example, while the residuals and oxides can be effectively removed away from the treated surface by chemically reacting with the second plasma, the usage of the first plasma is optional.

In general, the plasma treating process could only use inert gas plasma, such as helium gas plasma, to treat both first material layer and the patterned second material layer. The plasma treating process also could only use nitrogen gas plasma or only use hydrogen gas plasma to treat both the first material layer and the patterned second material layer. Moreover, the plasma treating process could separately use an inert gas, such as helium, plasma and a hydrogen gas plasma in sequence to separately treat both first material layer and the patterned second material layer. The plasma treating process further could separately use nitrogen gas plasma and hydrogen gas plasma in sequence to separately treat both first material layer and the patterned second material layer.

Another preferred embodiment of the present invention is a method for forming a thin film transistor. The embodiment will now be described with reference to FIGS. 2A–2I:

As shown in FIG. 2A to FIG. 2D, a substrate 20 is provided and a gate 21 is formed over substrate 20; a first dielectric layer 22, such as silicon nitride layer, is formed over substrate 20. First dielectric layer 22 also covers the gate 21; a silicon layer 23 is formed over both first dielectric layer 22 and gate 21, herein silicon layer 23 could be a polysilicon layer, an amorphous layer, a doped polysilicon layer or a doped amorphous layer. However, it must be emphasized that the key point of the embodiment is the formation of the structure shown in FIG. 2D. In other words, FIG. 2A to FIG. 2C only show some possible steps, and the embodiment does not limit the details about how to form the required structure, such as the shape of silicon layer 23.

Figure 2A:
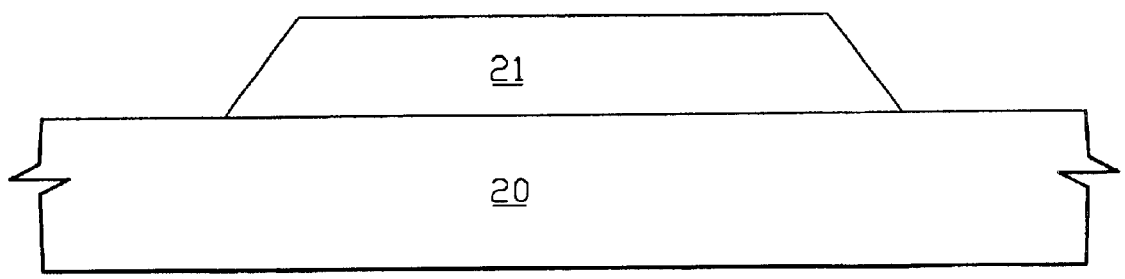
FIG. 2A to FIG. 2I are briefly illustrations of the essential steps of one preferred embodiment of the present invnetion.
Figure 2B:
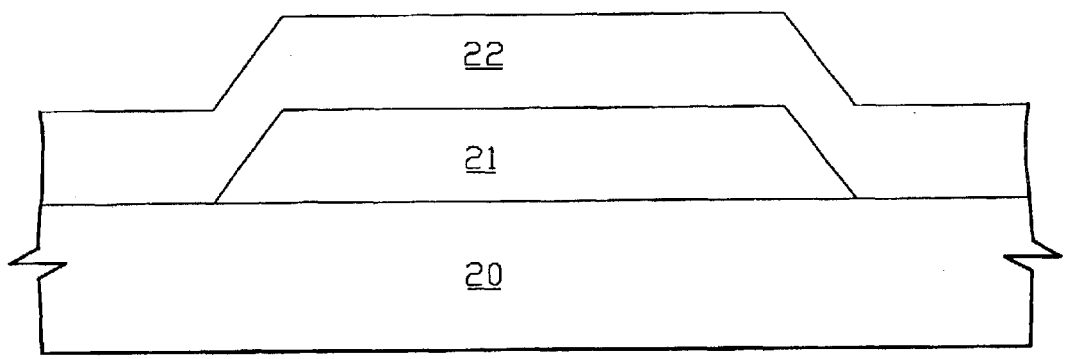
Figure 2C:
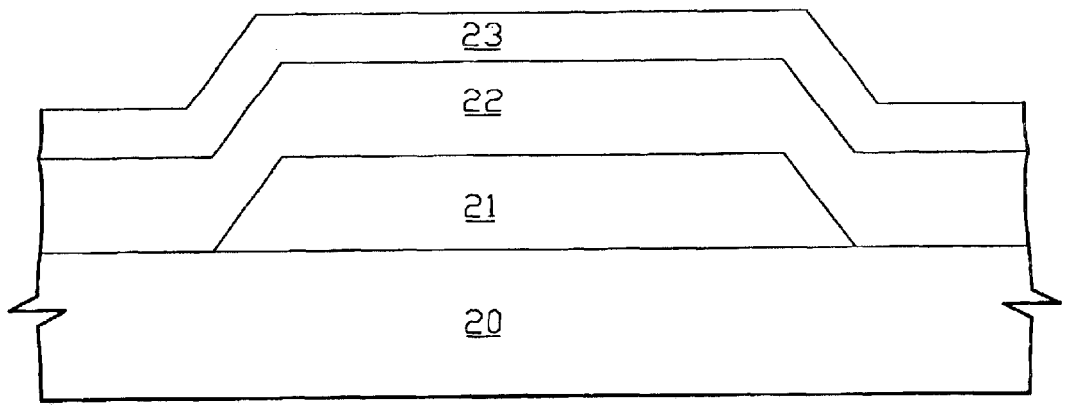
Figure 2D:
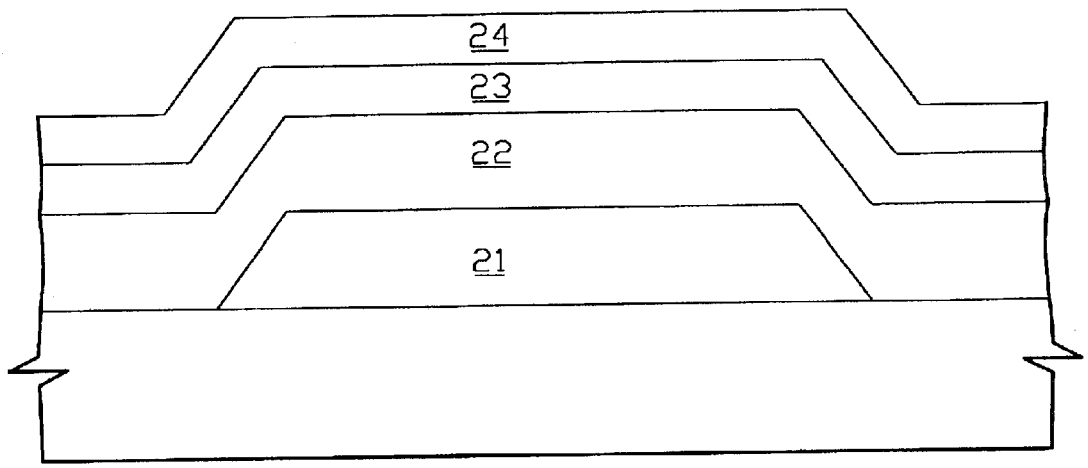
Figure 2E:
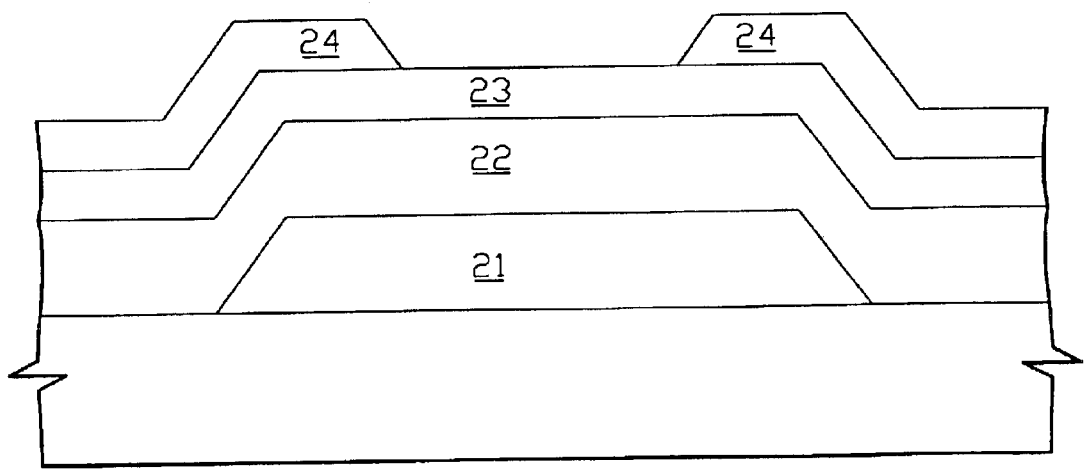

As shown in FIG. 2E, the patterned metal layer 24 exposes at a portion of the silicon layer 23 over the gate 21. Herein, it is an optional process to remove the exposed portion of silicon layer 23. Herein, the patterned metal layer 24 and the silicon layer 23 could be used to form the required elements, such as source, drain, channel and the conductive lines that are connected to source/drain. Moreover, the patterned metal layer 24 is usually patterned by the wet etch, but partial silicon layer 23 is usually removed by the dry etch. Further, the dry etch is usually let the surface of silicon layer 23 to be uneven, and the wet etch usually induces some residuals on the surface of patterned metal layer 24 and induces some unsaturated bonds on the surface of silicon layer 23.

Figure 2F:
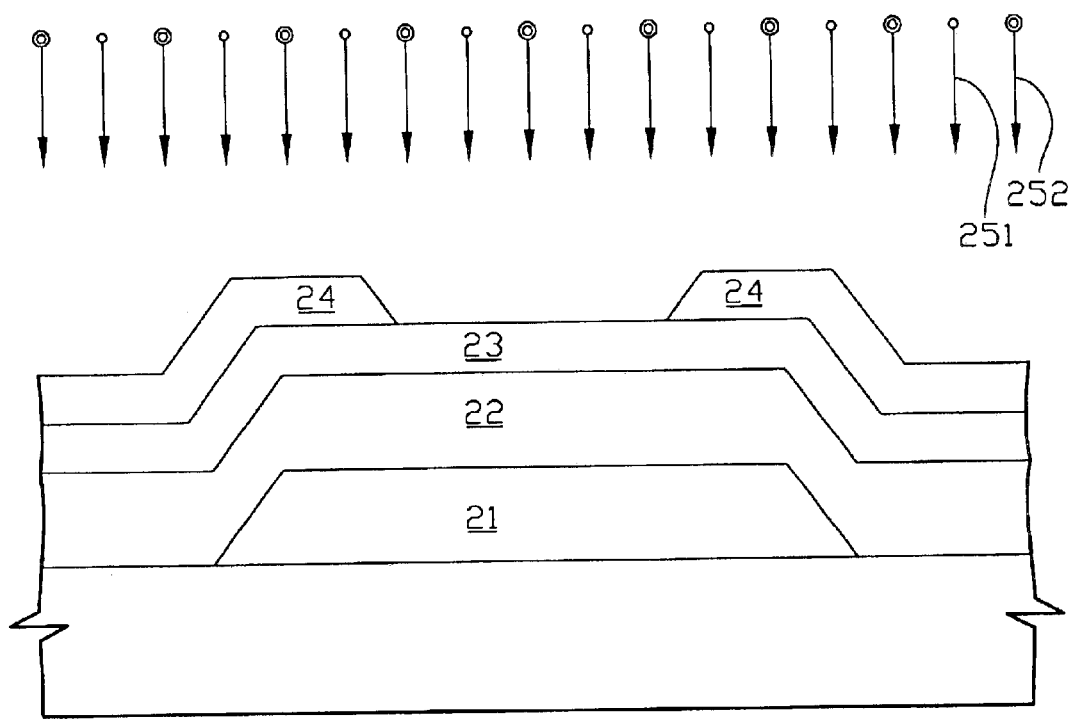

As shown in FIG. 2F, gas plasma 251 and/or cleaning process 252 is used to treat the patterned metal layer 24 and partial portion of silicon layer 23 which is not covered by patterned metal layer 24. Herein, it is possible to mix gas plasma 251 and cleaning process 252, to use gas plasma 251 and cleaning process 252, to only use gas plasma 251, or to only use cleaning process 252. In fact, the embodiment does not limit the details.

Figure 2G:
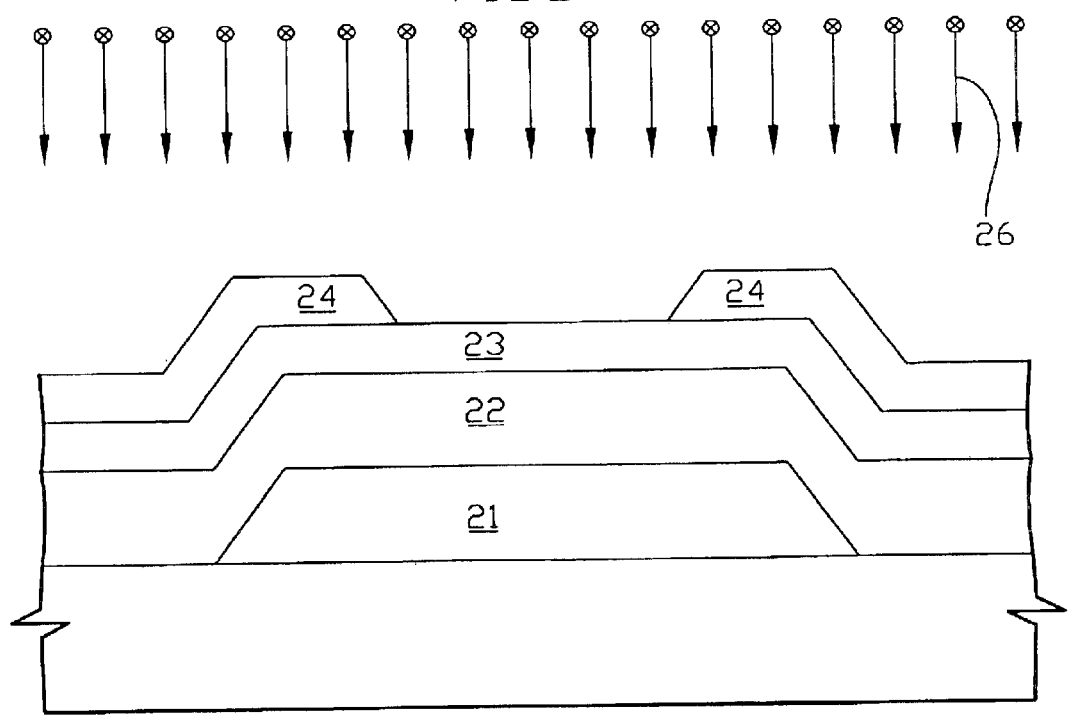

As shown in FIG. 2G, plasma treating process 26 is used to treat patterned metal layer 24 and partial silicon layer 23 not covered by patterned metal layer 24.

Figure 2H:
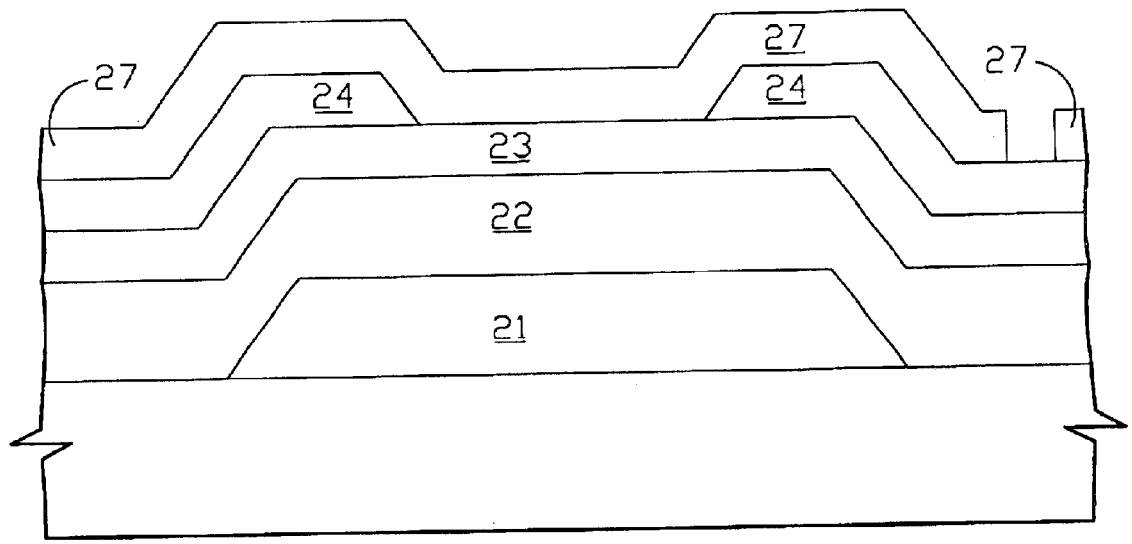

As shown in FIG. 2H, second dielectric layer 27, such as SIC layer, is formed over patterned metal layer 24 and partial silicon layer 23 that is not covered by patterned metal layer 24. Then, pattern second dielectric layer 27 exposes at least a portion of the metal layer 24 that is not located over gate 21.

Figure 2I:
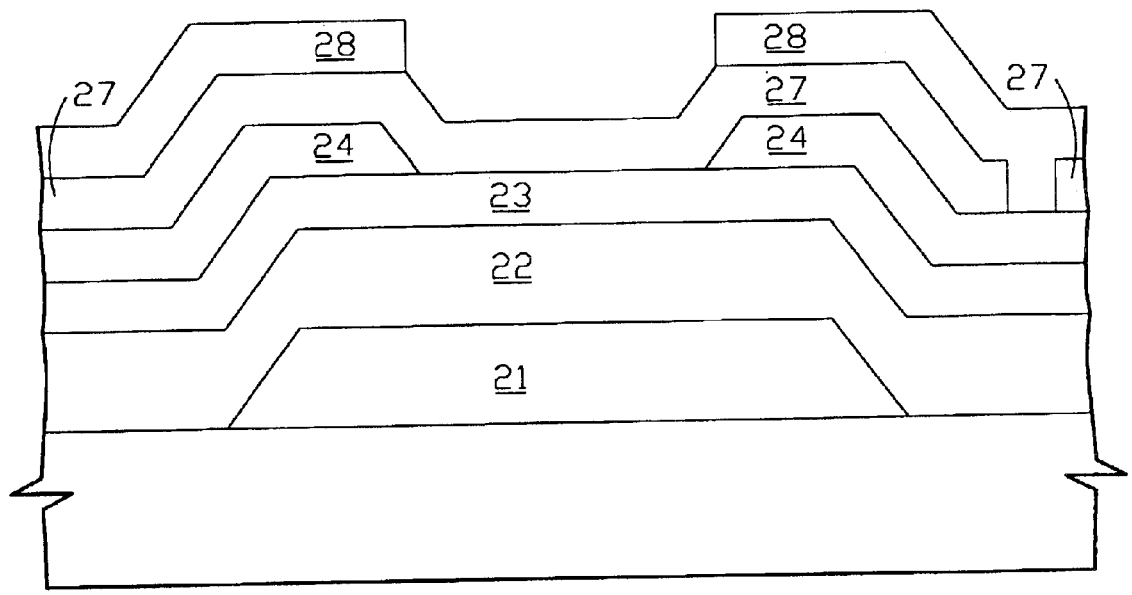

As shown in FIG. 2I, conductive material layer 28, such as ITO layer, is formed over patterned second dielectric layer 27. Then, the conductive material layer 28 is patterned. Herein, the conductive material layer 28 directly contacts with partial metal layer 24 that is not covered by patterned second dielectric layer 27.

As discussed in the previous embodiment, the plasma treating process could separately use helium gas plasma and hydrogen gas plasma in sequence to treat patterned metal layer 24 and silicon layer 23. The plasma treating process also could separately use an inert gas plasma and a hydrogen gas plasma in sequence to treat patterned metal layer 24 and silicon layer 23. The plasma treating process further could separately use a nitrogen gas plasma and a hydrogen gas plasma in sequence to treat patterned metal layer 24 and silicon layer 23.

In general, the plasma treating process usually initially uses first plasma to physically react with patterned metal layer 24 and silicon layer 23, and sequentially use second plasma to chemically react with patterned metal layer 24 and silicon layer 23. Moreover, the parameters of the second plasma could be adjusted to let the second plasma thoroughly reacted with numerous unsaturated bonds, such as dealing bonds and weak bonds, by inducing the first plasma. Moreover, the parameters of the second plasma could be adjusted to induce phase transition of patterned metal layer 24 and silicon layer 23 during the following processes, such as the formation of second dielectric layer 27. Further, the parameters of the second plasma treating process could be adjusted to induce migration of atoms and molecules on the surface of patterned metal layer 24 and the surface of silicon layer 23 during the following processes, such as the formation of second dielectric layer 27.

Furthermore, it should be noticed that the key point of the embodiment is that a plasma treating process is used to treat the etched surface. Moreover, the key point of the embodiment is that a plasma treating process is used to treat an etched surface after the conventional cleaning process. Therefore, the key point is that, when the plasma is performed to treat process and what plasma(s) is used. In contrast, the details of the used plasma(s), such as temperature and pressure, are not the key point of the embodiment.

Of course, it is to be understood that the invention need not be limited to these disclosed embodiments. Various modification and similar changes are still possible within the spirit of this invention. In this way, the scope of this invention should be defined by the appended claims.

What is claimed is:

1. A method for reducing the contact resistance, comprising:
   forming a first material layer on a substrate;
   forming a second material layer on said first material layer;
   patterning said second material layer;
   performing a cleaning process to treat both said first material layer and said patterned second material layer; and
   performing a plasma treating process with first gas plasma and second gas plasma separately in sequence to treat both said first material layer and patterned said second material layer.

2. The method according to claim 1, wherein said cleaning process is chosen from the group consisting of wet solution cleaning process and gas cleaning process.

3. The method according to claim 1, further comprising the step of removing portion of said first material layer during the period of patterning said second material layer.

4. The method according to claim 1, wherein the material of said first material layer and the material of said second material layer is chosen from the group consisting of metal layer, metal silicide layer, polysilicon layer, and amorphous silicon layer.

5. The method according to claim 1, wherein said plasma treating process using said first plasma to physically react with both said first material layer and said patterned second material layer initially, and sequentially using said second plasma to chemically react with both said first material layer and said patterned second material layer.

6. The method according to claim 5, wherein the parameters of said second plasma being adjusted to let said second plasma thoroughly react with a plurality of unsaturated bonds induced by said first plasma.

7. A method for forming a thin film transistor, comprising:
   providing a substrate, wherein at least a gate being formed over said substrate;
   forming a first dielectric layer, a silicon layer and a metal layer over said substrate in sequence, wherein said gate being covered by said first dielectric layer, said silicon layer and said metal layer;
   patterning said metal layer to expose at least partial portion of said silicon layer that is located over said gate;
   using at least a gas plasma to treat said patterned metal layer and said silicon layer;
   using a cleaning process to clean said patterned metal layer and said silicon layer;
   using a plasma treating process to treat said patterned metal layer and said silicon layer by using a first plasma to physically react with said patterned metal layer and said silicon layer initially, and sequentially by using a second plasma to chemically react with said patterned metal layer and said silicon layer;
   forming a second dielectric layer over said patterned metal layer and said silicon layer;
   patterning said second dielectric layer to expose at least a partial portion of said metal layer that is not located over said gate; and
   forming and patterning a conductive material layer over said patterned second dielectric layer, said patterned conductive material layer directly contacts with said partial portion of said metal layer that is not covered by said patterned second dielectric layer.

8. The method according to claim 7, further comprising the step of removing said partial portion of said silicon layer during the period that said metal layer is patterned.

9. The method according to claim 7, wherein said silicon layer is chosen from the group consisting of the following: an amorphous layer, a polysilicon layer, a doped polysilicon layer or and a doped amorphous layer.

10. The method according to claim 7, wherein said conductive material layer is an ITO layer.

11. The method according to claim 7, wherein said plasma treating process separately using a helium gas plasma and a hydrogen gas plasma in sequence to treat said patterned metal layer and said partial portion of said silicon layer.

12. The method according to claim 7, wherein said plasma treating process separately using an inert gas plasma and a hydrogen gas plasma in sequence to treat said patterned metal layer and said silicon layer.

13. The method according to claim 7, wherein said plasma treating process separately using a nitrogen gas plasma and a hydrogen gas plasma in sequence to treat said patterned metal layer, and said silicon layer.

14. The method according to claim 7, wherein the parameters of said second plasma being adjusted to let said second plasma thoroughly react with a plurality of unsaturated bonds induced by said first plasma.

15. A method for reducing the contact resistance, comprising:
   forming a first material layer on a substrate;
   forming a second material layer on said first material layer;
   patterning said second material layer and removing partial portion of said first material layer during the period of patterning said second material layer;
   performing a cleaning process to treat both said first material layer and said patterned second material layer; and
   performing a plasma treating process with using a first plasma to physically treat both said first material layer and said patterned second material layer initially, and sequentially using a second plasma to chemically react with both said first material layer and said patterned second material layer.

16. The method according to claim 15, wherein said cleaning process is chosen from the group consisting of wet solution cleaning process and gas cleaning process.

17. The method according to claim 15, the material of said first material layer and the material of said second material layer being chosen from the group consisting of metal layer, metal silicide layer, polysilicon layer and amorphous silicon layer.

18. The method according to claim 15, wherein the parameters of said second plasma are adjusted to let said second plasma thoroughly react with a plurality of unsaturated bonds induced by said first plasma.

19. A method for reducing the contact resistance, comprising:

forming a first material layer on a substrate;

forming a second material layer on said first material layer;

patterning said second material layer and removing partial portion of said first material layer during the period of patterning said second material layer;

performing a cleaning process to treat both said first material layer and said patterned second material layer; and performing a plasma treating process separately using nitrogen gas plasma and hydrogen gas plasma to treat both said first material layer and said patterned second material layer.

20. The method according to claim 19, wherein said cleaning process is chosen from the group consisting of wet solution cleaning process and gas cleaning process.

21. The method according to claim 19, the material of said first material layer and the material of said second material layer being chosen from the group consisting of metal layer, metal silicide layer, polysilicon layer and amorphous silicon layer.

22. The method according to claim 19, wherein said plasma treating process by using a first plasma to physically react with both said first material layer and said patterned second material layer initially, and sequentially using a second plasma to chemically react with both said first material layer and said patterned second material layer.

23. The method according to claim 22, the parameters of said second plasma being adjusted to let said second plasma thoroughly react with a plurality of unsaturated bonds induced by said first plasma.

24. A method for forming a thin film transistor, comprising:

providing a substrate, wherein at least a gate being formed over said substrate;

forming a first dielectric layer, a silicon layer and a metal layer over said substrate in sequence, wherein said gate being covered by said first dielectric layer, said silicon layer and said metal layer;

patterning said metal layer to expose at least partial portion of said silicon layer that is located over said gate;

using at least a gas plasma to treat said patterned metal layer and said silicon layer;

using a cleaning process to clean said patterned metal layer and said silicon layer;

using a plasma treating process to treat said patterned metal layer and said silicon layer by using a nitrogen gas plasma and a hydrogen gas plasma in sequence to treat said patterned metal layer, and said silicon layer;

forming a second dielectric layer over said patterned metal layer and said silicon layer;

patterning said second dielectric layer to expose at least a partial portion of said metal layer that is not located over said gate; and forming and patterning a conductive material layer over said patterned second dielectric layer, said patterned conductive material layer directly contacts with said partial portion of said metal layer that is not covered by said patterned second dielectric layer.

25. The method according to claim 24, further comprising the step of removing said partial portion of said silicon layer during the period that said metal layer is patterned.

26. The method according to claim, 24 wherein said silicon layer is chosen from the group consisting of the following: an amorphous layer, a polysilicon layer, a doped polysilicon layer and a doped amorphous layer.

27. The method according to claim 24, said conductive material layer being an ITO layer.

28. The method according to claim 24, wherein said plasma treating process by using a first plasma to physically react with said patterned metal layer and said silicon layer initially, and sequentially by using a second plasma to chemically react with said patterned metal layer and said silicon layer, wherein the parameters of said second plasma being adjusted to let said second plasma thoroughly react with a plurality of unsaturated bonds induced by said first plasma.

* * * * *